(12) United States Patent
Tachibana et al.

(10) Patent No.: US 8,674,338 B2
(45) Date of Patent: Mar. 18, 2014

(54) SEMICONDUCTOR LIGHT EMITTING DEVICE

(75) Inventors: Koichi Tachibana, Kanagawa-ken (JP); Toshiki Hikosaka, Tokyo (JP); Shigeya Kimura, Kanagawa-ken (JP); Hajime Nago, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 632 days.

(21) Appl. No.: 12/871,285

(22) Filed: Aug. 30, 2010

(65) Prior Publication Data

US 2011/0198633 A1 Aug. 18, 2011

(30) Foreign Application Priority Data

Feb. 16, 2010 (JP) ................................. 2010-031456

(51) Int. Cl.
*H01L 29/06* (2006.01)
*H01L 31/00* (2006.01)

(52) U.S. Cl.
USPC .................. 257/13; 257/14; 257/15; 257/17; 257/94; 257/E33.008; 257/E33.013

(58) Field of Classification Search
USPC .......... 257/13, 14, 86, 94, E33.013, E33.028, 257/E33.033, E33.034, E33.008, E29.072
See application file for complete search history.

(56) References Cited

U.S. PATENT DOCUMENTS

| 2001/0048112 A1* | 12/2001 | Koide et al. ...................... 257/94 |
| 2006/0108603 A1* | 5/2006 | Uemura et al. ............... 257/194 |
| 2008/0093593 A1* | 4/2008 | Ryu ................................. 257/13 |
| 2009/0256494 A1* | 10/2009 | Nishinaka et al. ............ 315/291 |
| 2010/0288999 A1* | 11/2010 | Kikuchi et al. ................. 257/13 |

FOREIGN PATENT DOCUMENTS

| JP | 7-297481 | 11/1995 |
| JP | 11-87773 A | 3/1999 |
| JP | 2002-270894 A | 9/2002 |
| JP | 2004-179428 | 6/2004 |
| JP | 2006-80525 A | 3/2006 |
| JP | 2007-110090 A | 4/2007 |

(Continued)

OTHER PUBLICATIONS

U.S. Appl. No. 13/030,440, filed Feb. 18, 2011, Tachibana, et al.

(Continued)

*Primary Examiner* — Benjamin Sandvik
*Assistant Examiner* — Leslie Pilar Cruz
(74) *Attorney, Agent, or Firm* — Oblon, Spivak, McClelland, Maier & Neustadt, L.L.P.

(57) ABSTRACT

According to one embodiment, a semiconductor light emitting device includes an n-type semiconductor layer, a p-type semiconductor layer, and a light emitting portion. The light emitting portion is provided between the semiconductor layers and includes barrier layers and well layers alternately stacked. An n-side end well layer which is closest to the n-type semiconductor layer contains $In_{wn}Ga_{1-wn}N$ and has a layer thickness $t_{wn}$. An n-side end barrier layer which is closest to the n-type semiconductor layer contains $In_{bn}Ga_{1-bn}N$ and has a layer thickness $t_{bn}$. A p-side end well layer which is closest to the p-type semiconductor layer contains $In_{wp}Ga_{1-wp}N$ and has a layer thickness $t_{wp}$. A p-side end barrier layer which is closest to the p-type semiconductor contains $In_{bp}Ga_{1-bp}N$ and has a layer thickness $t_{bp}$. A value of $(wp \times t_{wp} + bp \times t_{bp})/(t_{wp} + t_{bp})$ is higher than $(wn \times t_{wn} + bn \times t_{bn})/(t_{wn} + t_{bn})$ and is not higher than 5 times $(wn \times t_{wn} + bn \times t_{bn})/(t_{wn} + t_{bn})$.

21 Claims, 4 Drawing Sheets

(56) References Cited

FOREIGN PATENT DOCUMENTS

| JP | 2007-123878 | | 5/2007 |
|----|-------------|---|--------|
| JP | 2008-34848 | A | 2/2008 |
| JP | 2009-289983 | A | 12/2009 |
| WO | WO 2009050955 A1 * | | 4/2009 |

OTHER PUBLICATIONS

U.S. Appl. No. 13/206,700, filed Aug. 10, 2011, Tachibana, et al.
U.S. Appl. No. 12/874,510, filed Sep. 2, 2010, Tachibana, et al.
U.S. Appl. No. 12/875,503, filed Sep. 3, 2010, Hikosaka, et al.
Office Action issued Dec. 9, 2011 in Japanese Patent Application No. 2010-031456 (with English translation).
Office Action issued Jan. 23, 2013 in Japanese Patent Application No. 2012-012637 (with English-language translation).
Office Action issued Oct. 1, 2013, in Japanese Patent Application No. 2012-012637, (with English-language Translation).
Japanese Office Action issued Sep. 5, 2011, in Patent Application No. 2010-031456 (with English-language translation).

* cited by examiner

SEMICONDUCTOR LIGHT EMITTING DEVICE

CROSS-REFERENCE TO RELATED APPLICATIONS

This application is based upon and claims the benefit of priority from the prior Japanese Patent Application No. 2010-031456, filed on Feb. 16, 2010; the entire contents of which are incorporated herein by reference.

FIELD

Embodiments described herein relate generally to a semiconductor light emitting device.

BACKGROUND

Using nitride-based III-V group compound semiconductors such as gallium nitride (GaN), there have been developed semiconductor light emitting devices such as high-intensity ultraviolet to blue and green light emitting diodes (LED) and blue-violet to blue and green laser diodes (LD).

In order to provide an LED with higher efficiency, it is important to enhance internal quantum efficiency of a crystal by improving crystallinity of a GaN-based semiconductor.

Since a GaN-based semiconductor and sapphire used as a substrate have extremely high refractivity, multiple reflections occur inside a chip of a semiconductor light emitting device. As a result, low light extraction efficiency is likely to be obtained.

JP-A 2007-123878 (Kokai) proposes a configuration in which an energy band gap of a quantum well layer adjacent to an n-type nitride semiconductor layer is set to be larger than that of a quantum well layer adjacent to a p-type nitride semiconductor layer, with a view to improving internal quantum efficiency and luminance and decreasing an operating voltage.

However, this technique still has room for improving the efficiency.

DETAILED DESCRIPTION

Figure 1:
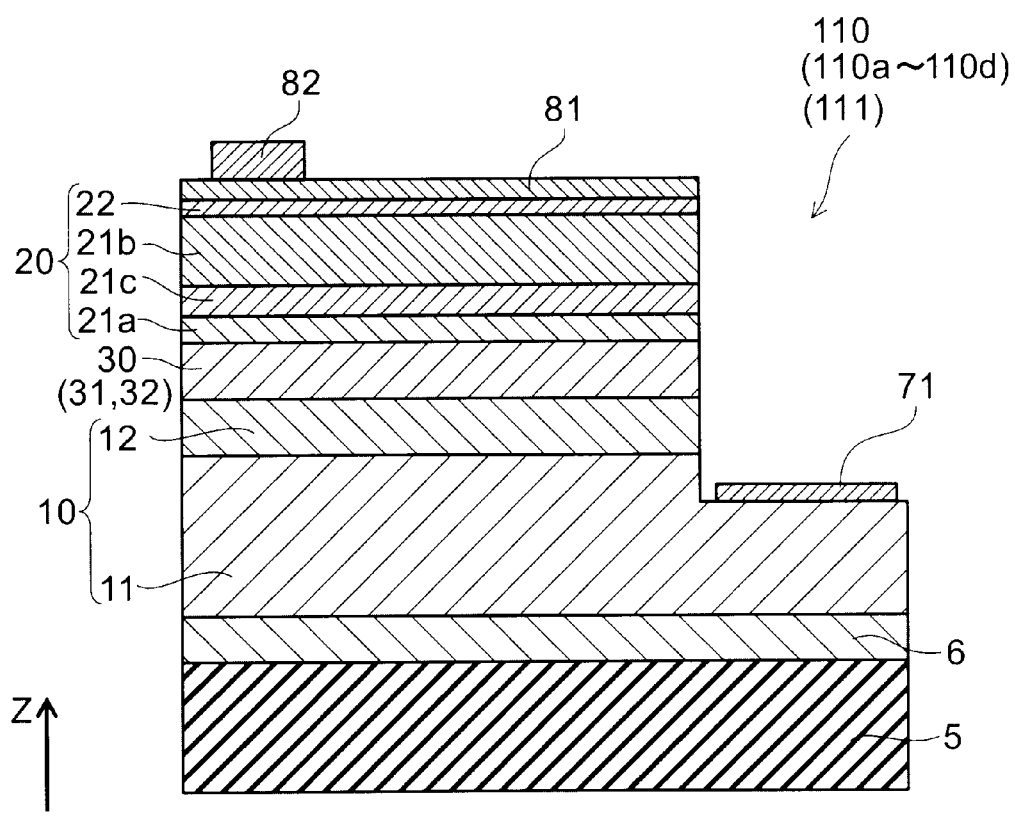
FIG. 1 is a schematic cross-sectional view showing a semiconductor light emitting device.

In general, according to one embodiment, a semiconductor light emitting device includes an n-type semiconductor layer, a p-type semiconductor layer, and a light emitting portion. The n-type semiconductor layer contains a nitride semiconductor. The p-type semiconductor layer contains a nitride semiconductor. The light emitting portion is provided between the n-type semiconductor layer and the p-type semiconductor layer and includes a plurality of barrier layers and a plurality of well layers. The plurality of barrier layers and the plurality of well layers are alternately stacked. The layers include an n-side end well layer which is one of the well layers and is closest to the n-type semiconductor layer among the well layers. The n-side end well layer contains $In_{wn}Ga_{1-wn}N$, where In composition ratio wn is an atomic ratio of In among group III elements. The n-side end well layer has a layer thickness $t_{wn}$ (nanometer). The barrier layers include an n-side end barrier layer which is one of the barrier layers and is closest to the n-type semiconductor layer among the barrier layers. The n-side end barrier layer contains $In_{bn}Ga_{1-bn}N$, where In composition ratio bn is an atomic ratio of In among group III elements. The n-side end barrier layer has a layer thickness $t_{bn}$ (nanometer). The well layers include a p-side end well layer which is another of the well layers and is closest to the p-type semiconductor layer among the well layers. The p-side end well layer contains $In_{wp}Ga_{1-wp}N$, where In composition ratio wp is an atomic ratio of In among group III elements. The p-side end well layer has a layer thickness $t_{wp}$ (nanometer). The barrier layers include a p-side end barrier layer which is another of the barrier layers and is closest to the p-type semiconductor layer among the barrier layers in a region between the p-side end well layer and the n-type semiconductor layer. The p-side end barrier layer contains $In_{bp}Ga_{1-bp}N$, where In composition ratio by is an atomic ratio of In among group III elements. The p-side end barrier layer has a layer thickness $t_{bp}$ (nanometer). A first ratio is defined as $(wp \times t_{wp} + bp \times t_{bp})/(t_{wp} + t_{bp})$. A second ratio is defined as $(wn \times t_{wn} + bn \times t_{bn})/(t_{wn} + t_{bn})$. The first ratio is higher than a second ratio and is not higher than 5 times the second ratio.

Hereinafter, embodiments of the invention will be described in detail with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

Embodiment

FIG. 1 is a schematic cross-sectional view illustrating the configuration of a semiconductor light emitting device according to an embodiment of the invention.

Figure 2:
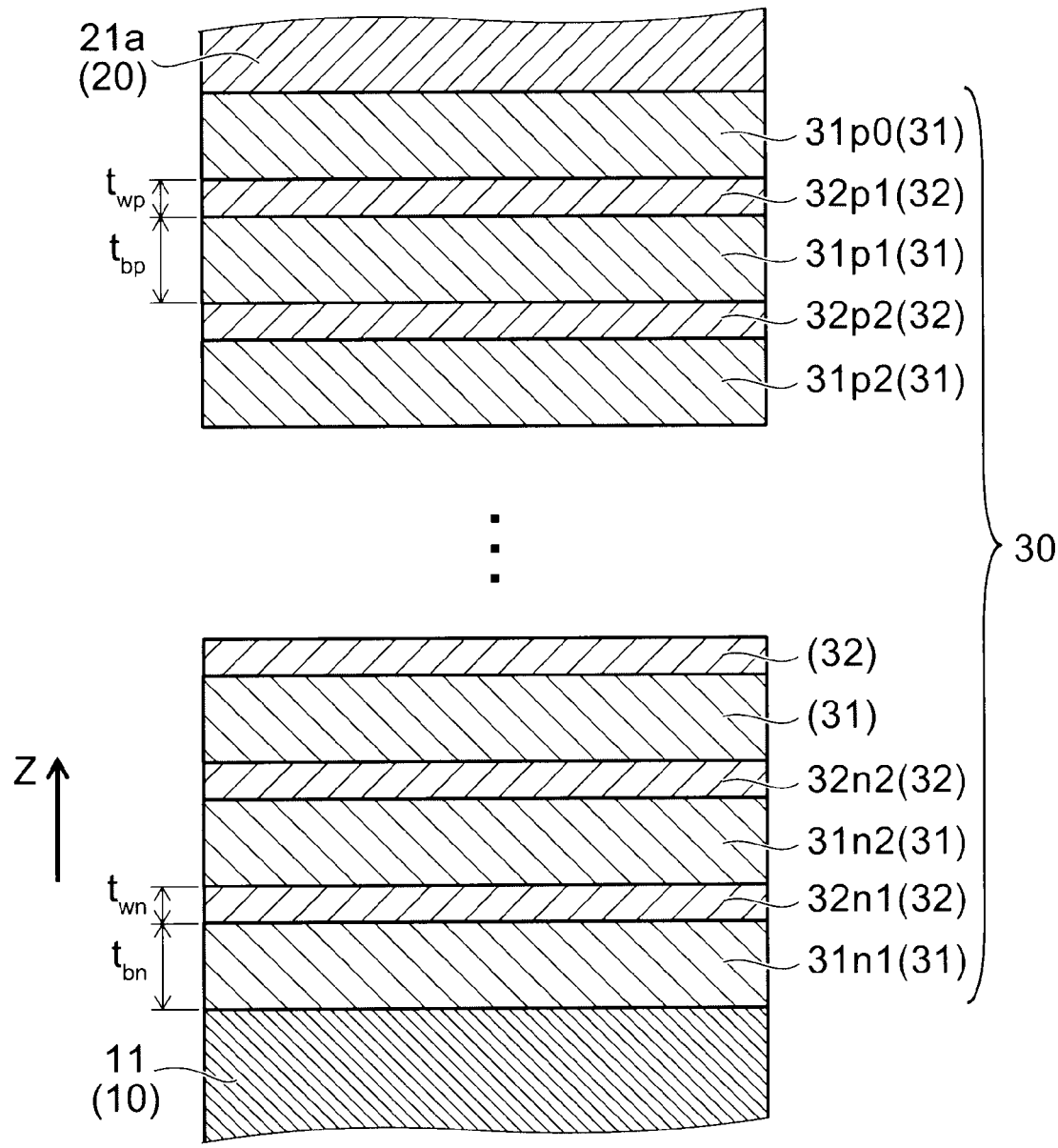
FIG. 2 is a schematic cross-sectional view showing part of the semiconductor light emitting device.

FIG. 2 is a schematic cross-sectional view illustrating part of the configuration of the semiconductor light emitting device according to the embodiment of the invention.

As shown in FIG. 1, a semiconductor light emitting device 110 according to the embodiment of the invention includes an n-type semiconductor layer 10 containing a nitride semiconductor, a p-type semiconductor layer 20 containing a nitride semiconductor, a light emitting portion 30 provided between the n-type semiconductor layer 10 and the p-type semiconductor layer 20.

The light emitting portion 30 includes multiple barrier layers 31 and multiple well layers 32, each of which is alternately stacked with each other. For example, the light emitting portion 30 includes multiple barrier layers 31 and multiple well layers 32, each of which is provided between the barrier layers 31.

As shown in FIG. 1, the n-type semiconductor layer 10, the light emitting portion 30, and the p-type semiconductor layer 20 are stacked along a Z-axis direction.

As illustrated in FIG. 1, the n-type semiconductor layer 10 may include, for example, an n-type GaN layer 11 and an n-type guide layer 12 provided between the n-type GaN layer 11 and the light emitting portion 30. The n-type guide layer 12 is based on GaN or InGaN with an n-type impurity such as Si, for example.

The p-type semiconductor layer 20 may include, for example, a p-type GaN contact layer 22, a first p-type guide layer 21a provided between the p-type GaN contact layer 22 and the light emitting portion 30, a second p-type guide layer 21b provided between the p-type GaN contact layer 22 and the first p-type guide layer 21a, and a third p-type guide layer 21c provided between the first p-type guide layer 21a and the second p-type guide layer 21b. The third p-type guide layer 21c functions as an electronic overflow suppressing layer, for example. The p-type semiconductor layer 20 contains a p-type impurity such as Mg which is doped thereinto.

As shown in FIG. 1, the semiconductor light emitting device 110 according to the embodiment may include a substrate 5 made of, for example, sapphire, a buffer layer 6 provided thereon, the n-type GaN layer 11 provided on the buffer layer 6, and the n-type guide layer 12 provided on the n-type GaN layer 11.

Then, the light emitting portion 30 (the barrier layers 31 and the well layers 32) is provided on the n-type guide layer 12.

The first p-type guide layer 21a is provided on the light emitting portion 30. The third p-type guide layer 21c is provided on the first p-type guide layer 21a. The second p-type guide layer 21b is provided on the third p-type guide layer 21c. The p-type GaN contact layer 22 is provided on the second p-type guide layer 21b.

On a first major surface on the p-type semiconductor layer 20 side of the stacked structure having the configuration as described above, the n-type semiconductor layer 10, the light-emitting portion 30 and the p-type semiconductor layer 20 are partially removed, and, thus, the n-type semiconductor layer 10 is exposed on the first major surface side. An n-side electrode 71 is provided in contact with the exposed n-type semiconductor layer 10 and a p-side electrode 81 is provided in contact with the p-type semiconductor layer 20. Furthermore, a p-side pad electrode 82 may be provided in contact with the p-side electrode 81.

As shown in FIG. 2, in the light emitting portion 30 of the semiconductor light emitting device 110, the multiple barrier layers 31 and the multiple well layers 32 are stacked with each other.

The n-side end well layer 32n1, which is the closest to the n-type semiconductor layer 10 among the multiple well layers 32, contains $In_{wn}Ga_{1-wn}N$, where In composition ratio wn is an atomic ratio of In among group III elements. In other words, an In composition ratio of the n-side end well layer 32n1 is wn. The thickness of the n-side end well layer 32n1 along the Z-axis direction is set to be a layer thickness $t_{wn}$ (the n-side end well layer thickness $t_{wn}$, nanometers).

The n-side end barrier layer 31n1, which is the closest to the n-type semiconductor layer 10 among the multiple barrier layers 31, contains $In_{bn}Ga_{1-bn}N$, where In composition ratio bn is an atomic ratio of In among group III elements. In other words, an In composition ratio of the n-side end barrier layer 31n1 is bn. The thickness of the n-side end barrier layer 31n1 along the Z-axis direction is set to be a layer thickness $t_{bn}$ (the n-side end barrier layer thickness $t_{bn}$, nanometers).

The p-side end well layer 32p1, which is the closest to the p-type semiconductor layer 20 among the multiple well layers 32, contains $In_{wp}Ga_{1-wp}N$, where In composition ratio wp is an atomic ratio of In among group III elements. In other words, an In composition ratio of the p-side end well layer 32p1 is wp. The thickness of the p-side end well layer 32p1 in the Z-axis direction is set to be a layer thickness $t_{wp}$ (the p-side end well layer thickness $t_{wp}$, nanometers).

The p-side end barrier layer 31p1, which is the closest to the p-type semiconductor layer 20 among the multiple barrier layers 31 in a region between the p-side end well layer 32p1 and the n-type semiconductor layer 10, contains $In_{bp}Ga_{1-bp}N$, where In composition ratio by is an atomic ratio of In among group III elements. In other words, an In composition ratio of the p-side end barrier layer 31p1 is bp. The thickness of the p-side end barrier layer 31p1 along the Z-axis direction is set to be a layer thickness $t_{bp}$ (the p-side end barrier layer thickness $t_{bp}$, nanometers).

The In composition ratio indicates herein a ratio (atomicity ratio) of In among the group III elements.

In the specific example, a p-side end opposite barrier layer 31p0 is provided between the p-side end well layer 32p1 and the p-type semiconductor layer 20 as another barrier layer 32. For this reason, the p-side end barrier layer 31p1 is the second closest to the p-type semiconductor layer 20 among the multiple barrier layers 31. The p-side end opposite barrier layer 31p0 is provided as needed and may be omitted in some cases.

An n-side end average In composition ratio An (a second ratio) is defined as $(wn \times t_{wn} + bn \times t_{bn})/(t_{wn}+t_{bn})$.

Similarly, a p-side end average In composition ratio Ap (a first ratio) is defined as $(wp \times t_{wp} + bp \times t_{bp})/(t_{wp}+t_{bp})$.

In the semiconductor light emitting device 110 according to the embodiment, the p-side end average In composition ratio Ap is set to be high than the n-side end average In composition ratio An and is set to be not higher than 5 times the n-side end average In composition ratio An.

As described above, a pn ratio Ap/An in the In average composition ratio is set to be equal to or smaller than 5, so that internal quantum efficiency and light extraction efficiency can be improved.

In other words, the p-side end average In composition ratio Ap is set to be higher than the n-side end average In composition ratio An, so that a proper distortion is added to the p-side end well layer 32p1. In addition, the n-side end average In composition ratio An is set to be smaller, so that light absorption in the n-side end well layer 32n1 can be suppressed. Moreover, injection efficiency of holes moving from p-side end well layer 32p1 to the well layer 32p2, which is the second closest to the p-type semiconductor layer 20, is improved. Accordingly, the internal quantum efficiency and the light extraction efficiency can be improved.

The above-described semiconductor light emitting device 110 is fabricated as follows, for example.

A buffer layer 6 is formed on a substrate 5 made of sapphire and, thereafter, the crystal of the n-type GaN layer 11 into which an n-type impurity is doped is grown. The thickness of the n-type GaN layer 11 is, for example, approximately 4 μm (micrometers).

For the crystal growth, for example, a MOCVD (Metal Organic Chemical Vapor Deposition) method is used. In addition to this method, an MBE (Molecular Beam Epitaxy) method and the like may be used for the crystal growth. The n-type impurity may include various elements such as Si, Ge, and Sn. In the specific example, Si is used. A doping amount of Si is, for example, approximately $2 \times 10^{18}$ cm$^{-3}$. The substrate 5 may be based on various materials such as GaN, SiC, Si, GaAs in addition to sapphire.

After that, the crystal of the n-type guide layer 12 is grown on the n-type GaN layer 11. The n-type guide layer 12 is based on GaN with an n-type impurity with an amount of approximately $1 \times 10^{18}$ cm$^{-3}$, for example. The thickness of the n-type guide layer 12 is approximately 0.1 μm, for example.

The temperatures of growing the n-type GaN layer 11 and the n-type guide layer 12 are, for example, 1000° C. to 1100° C.

As the n-type guide layer 12, $In_{0.01}Ga_{0.99}N$ may be also used in addition to GaN. When $In_{0.01}Ga_{0.99}N$ is used for the n-type guide layer 12, the growing temperature is 700° C. to 800° C., for example. When $In_{0.01}Ga_{0.99}N$ is used for the n-type guide layer 12, the thickness of the n-type guide layer 12 may be 0.1 μm, for example.

After that, the light emitting portion 30 is formed on the n-type guide layer 12. For example, the light emitting portion 30 is formed by alternately stacking barrier layers 31 and well layers 32. Accordingly, an MQW (Multiple Quantum Well) structure is formed. The configurations of the barrier layers 31 and the well layers 32 are set as described above. The temperatures of growing the barrier layers 31 and the well layer 32 are 700° C. to 800° C., for example. An n-type impurity with a doping amount of approximately $1 \times 10^{18}$ $cm^{-3}$ may be doped into the barrier layers 31. The barrier layers 31 may be undoped layers.

The first p-type guide layer 21a is grown on the light emitting portion 30. The first p-type guide layer 21a is based on GaN. The thickness of the first p-type guide layer 21a is set to be equal to or smaller than approximately 30 nm. The growing temperature of GaN to make the first p-type guide layer 21a is 1000° C. to 1100° C., for example. The p-type impurity may include various elements such as Mg and Zn. Mg is used here. The doping amount of Mg is approximately $4 \times 10^{18}$ $cm^{-3}$. In addition, the first p-type guide layer 21a may be based on $In_{0.01}Ga_{0.99}N$, for example. The thickness of the first p-type guide layer 21a at this time is approximately 30 nm. The first p-type guide layer 21a may be based on $In_{0.01}Ga_{0.99}N$. When $In_{0.01}Ga_{0.99}N$ is used as the first p-type guide layer 21a, the growing temperature is, for example, 700° C. to 800° C.

After that, the third p-type guide layer 21c is formed on the first p-type guide layer 21a. The third p-type guide layer 21c may be based on $Al_{0.2}Ga_{0.8}N$ doped with a p-type impurity. The p-type impurity may be also Mg in this case. The doping amount of Mg is approximately $4 \times 10^{18}$ $cm^{-3}$, for example. The thickness of the third p-type guide layer 21c is approximately 10 nm, for example. The third p-type guide layer 21c may function as an electronic overflow suppressing layer. The growing temperature of $Al_{0.2}Ga_{0.8}N$ used for the third p-type guide layer 21c is 1000° C. to 1100° C., for example.

After that, the second p-type guide layer 21b is formed on the third p-type guide layer 21c. The second p-type guide layer 21b is based on a p-type GaN layer, for example. The p-type impurity may be also Mg in this case, and Mg is doped with an amount of $1 \times 10^{19}$ $cm^{-3}$, for example. The thickness of the second p-type guide layer 21b is approximately 50 nm, for example. The growing temperature of the GaN layer used for the second p-type guide layer 21b is 1000° C. to 1100° C., for example.

After that, the p-type GaN contact layer 22 is formed on the second p-type guide layer 21b. The p-type GaN contact layer 22 is based on a GaN layer doped with Mg with an amount of $1 \times 10^{20}$ $cm^{-3}$, for example. The thickness of the p-type GaN contact layer 22 is approximately 60 nm, for example.

The following device processes are performed on the wafer on which the above-described crystal growth is sequentially performed.

The p-side electrode 81 made of, for example, indium tin oxide (ITO) is formed on the p-type GaN contact layer 22. The thickness of ITO is 0.2 μm, for example. An Au film with a thickness of, for example, 1.0 μm is partially formed on the ITO as the p-side pad electrode 82.

The p-side electrode 81 (and the p-side pad electrode 82) is formed and, thereafter, dry etching is partially performed on the stacked structure to partially expose the n-type GaN layer 11. Then, the n-side electrode 71 is formed on the portion where the n-type GaN layer 11 is exposed. The n-side electrode 71 is based on, for example, a compound film made of titanium/platinum/gold (Ti/Pt/Au). The thickness of this Ti film is approximately 0.5 μm, for example. The thickness of the Pt film is approximately 0.05 μm, for example. The thickness of the Au film is 1.0 μm, for example.

The semiconductor light emitting device 110 is fabricated as described above.

In the light emitting portion 30, the p-side end average In composition ratio Ap is set to be higher than the n-side end average In composition ratio An and is set to be not higher than 5 times the n-side end average In composition ratio An. As a result, a semiconductor light emitting device that achieves high internal quantum efficiency and high light extraction efficiency can be provided.

Hereinafter, the description is given of experimental results which serve as the base for creating the configuration of the embodiment as described above. The inventors fabricated the two kinds of semiconductor light emitting devices 111 and 119 in which configurations of light emitting portions 30 are different from each other and evaluated the characteristics thereof, as described below.

The semiconductor light emitting device 111 has the configuration of this embodiment, and thus, corresponds to one example. One the other hand, the semiconductor light emitting device 119 does not have the configuration of the embodiment, and thus, corresponds to a comparative example (a first comparative example).

The semiconductor light emitting device 111 is fabricated by the foregoing fabricating method. The configuration of the light emitting portion 30 of the semiconductor light emitting device 111 and the fabricating method thereof are as follows.

In the light emitting portion 30, the n-side end barrier layer 31n1 containing $In_{0.01}Ga_{0.99}N$ is formed on the n-type guide layer 12, and, thereafter, the n-side end well layer 32n1 containing undoped $In_{0.07}Ga_{0.93}N$ is formed thereon. Furthermore, a barrier layer 31 containing $In_{0.01}Ga_{0.99}N$ and a well layer 32 containing undoped $In_{0.07}Ga_{0.93}N$ are alternately formed in pair for 4 times (8 layers in total) on the n-side end well layer 32n1. In this manner, the five well layers 32 containing $In_{0.07}Ga_{0.93}N$ are formed on the side of the n-type semiconductor layer 10. In the above-described case, the thickness of the well layer 32 is 2.5 nm and the thickness of the barrier layer 31 is 5.0 nm.

Furthermore, a barrier layer 31 containing $In_{0.01}Ga_{0.99}N$ and a well layer 32 containing undoped $In_{0.15}Ga_{0.85}N$ are alternately formed in pair for 3 times (6 layers in total) on the stacked layers of the well layers 32 and the barrier layers 31. In this manner, the three well layers containing $In_{0.15}Ga_{0.85}N$ are formed on the side of the p-type semiconductor layer 20. After that, an $In_{0.01}Ga_{0.99}N$ layer as the p-side end opposite barrier layer 31p0 is further formed on the well layer 32, which is the closest to the p-type semiconductor layer 20.

Thereafter, a first p-type guide layer 21a is formed on the $In_{0.01}Ga_{0.99}N$ layer under the above-described conditions.

In the semiconductor light emitting device 111, the In composition ratio wn of the n-side end well layer 32n1 is 0.07 and the n-side end well layer thickness $t_{wn}$ is 2.5 nm. In addition, the In composition ratio bn of the n-side end barrier layer 31n1 is 0.01 and the n-side end barrier layer thickness $t_{bn}$ is 5.0 nm. The In composition ratio wp of the p-side end well layer 32p1 is 0.15 and the p-side end well layer thickness $t_{wp}$ is 2.5 nm. The In composition ratio by of the p-side end barrier layer 31p1 is 0.01 and the p-side end barrier layer thickness $t_{bp}$ is 5.0 nm.

Accordingly, in the semiconductor light emitting device 111, the n-side end average In composition ratio An=(wn× $t_{wn}$+bn×$t_{bn}$)/($t_{wn}$+$t_{bn}$) is 0.030 and the p-side end average In composition ratio Ap=(wp×$t_{wp}$+bp×$t_{bp}$)/($t_{wp}$+$t_{bp}$) is 0.057. Thus, the pn ratio Ap/An in the In average composition ratio in the semiconductor light emitting device 111 is 1.9.

In the semiconductor light emitting device 111, the peak wavelength of light emitted from the $In_{0.07}Ga_{0.93}N$ layer with a thickness of 2.5 nm, which is used for the well layers 32 (including the n-side end well layer 32n1 and the like) provided on the side of the n-type semiconductor layer 10, is 400 nm from the evaluation result of photoluminescence. On the other hand, the peak wavelength of light emitted from the $In_{0.15}Ga_{0.85}N$ layer with a thickness of 2.5 nm, which is used for the well layers 32 (including the p-side end well layer 32p1 and the like) provided on the p-type semiconductor layer 20, is 450 nm from the evaluation result of photoluminescence.

In contrast, in the light emitting portion 30 of the semiconductor light emitting device 119, all the barrier layers 31 have the same configuration and all the well layers 32 have the same configuration.

In other words, the In composition ratio of the well layer 32 is 0.15 and the well layer 32 is $In_{0.15}Ga_{0.85}N$. The thickness of the well layer 32 is 2.5 nm. In addition, the In composition ratio of the barrier layer 31 is 0.01 and the barrier layer 31 is $In_{0.01}Ga_{0.99}N$. The thickness of the barrier layer 31 is 5.0 nm. Apart from these portions, the configuration is the same as that of the semiconductor light emitting device 111.

In the semiconductor light emitting device 119, the In composition ratio wn and the In composition ratio wp of the well layer 32 are 0.15 and the n-side end well layer thickness t" and the p-side end well layer thickness $t_{wp}$ are 2.5 nm. The In composition ratio bn and the In composition ratio by of the barrier layer 31 are 0.01 and the n-side end barrier layer thickness $t_{bn}$ and the p-side end barrier layer thickness $t_{bp}$ are 5.0 nm. In addition, the pn ratio Ap/An in the In average composition ratio is 1.

The characteristics of the semiconductor light emitting devices 111 and 119 having such configurations are evaluated.

Figure 3A:
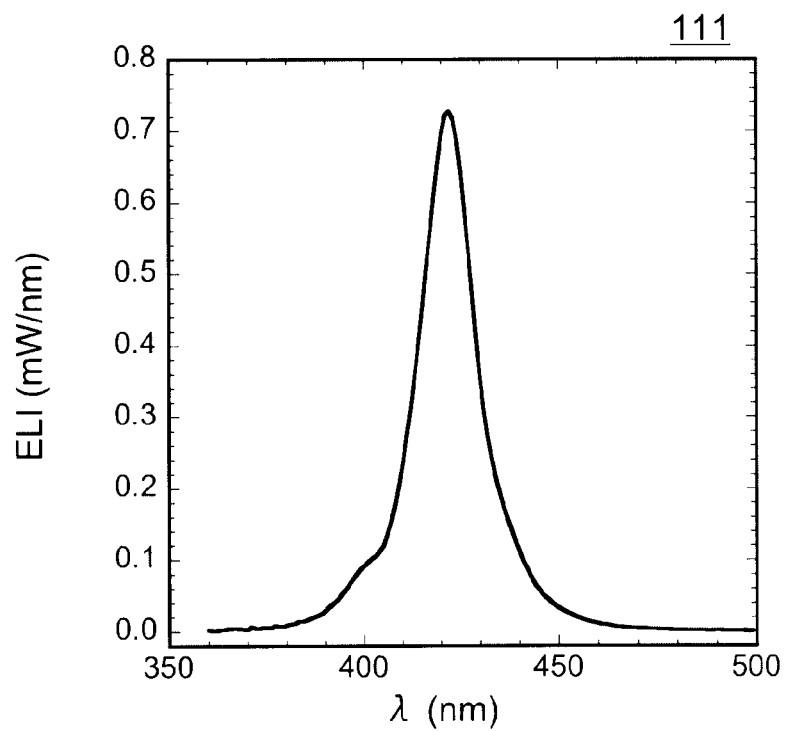
FIGS. 3A and 3B are graphs showing experimental results with regard to semiconductor light emitting devices.
Figure 3B:
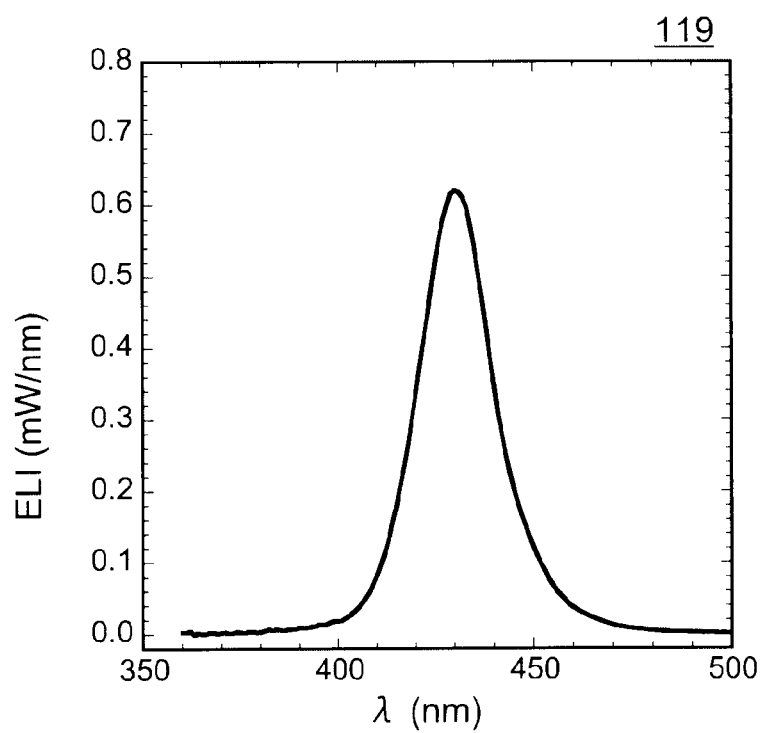

FIGS. 3A and 3B are graphs, each illustrating experimental results with regard to the semiconductor light emitting devices.

More specifically, FIGS. 3A and 3B show results of measuring the characteristics of the semiconductor light emitting devices 111 and 119. In FIGS. 3A and 3B, the horizontal axis is a wavelength λ (nm) and the vertical axis is a light emitting intensity ELI (mW/nm).

As shown in FIG. 3A, the maximum value of the light emitting intensity ELI of the semiconductor light emitting device 111 is approximately 0.74 mW/nm. On the other hand, the maximum value of the light emitting device 119 is approximately 0.62 mW/nm. The semiconductor light emitting device 111 has a higher light emitting intensity than that of the semiconductor light emitting device 119.

Furthermore, when FIGS. 3A and 3B are compared with each other, a full width at half maximum FWHM of the light emitting intensity ELI of the semiconductor light emitting device 111 is smaller than that of the semiconductor light emitting device 119.

As described above, the semiconductor light emitting device 111 shows more preferable characteristic than that of the semiconductor light emitting device 119. It is thought that this comes from that internal quantum efficiency and light extraction efficiency are high in the semiconductor light emitting device 111.

On the other hand, when the characteristics of the semiconductor light emitting devices 111 and 119 are further to compared with each other, in the semiconductor light emitting device 111 shown in FIG. 3A, only small peak of the light emitting intensity ELI exists at the wavelength λ of approximately 400 nm.

As described above, the peak wavelength of the $In_{0.15}Ga_{0.85}N$ layer is 450 nm. Therefore, it is natural that the peak wavelength of the semiconductor light emitting device 119 is 450 nm. On the other hand, in the semiconductor light emitting device 111 having the configuration in which three $In_{0.15}Ga_{0.85}N$ layers, each having the peak wavelength of 450 nm, and the five $In_{0.07}Ga_{0.93}N$ layers, each having the peak wavelength of 450 nm, are stacked with one another, the height of the light emitting peak of 400 nm is extremely smaller than the height of the light emitting peak of 450 nm.

In the semiconductor light emitting device 111, the number of the $In_{0.15}Ga_{0.85}N$ layers having the peak wavelength of 450 nm is smaller than the number of the $In_{0.07}Ga_{0.93}N$ layers having the peak wavelength of 400 nm. Nevertheless, the light emitting intensity ELI of 450 nm, which is the peak wavelength of the $In_{0.15}Ga_{0.85}N$ layer provided on the side of the p-side semiconductor layer 20, is extremely high. The characteristics of the well layer 32 adjoining the p-type semiconductor layer 20 are dominant in the light emitting characteristics of a semiconductor light emitting device.

The p-side end well layer 32p1 has a band gap energy corresponding to the light emitting peak wavelength of the light emitted from the light emitting portion 30, and the n-side end well layer 32n1 has a band gap energy corresponding to a wavelength shorter than the light emitting peak wavelength of the light emitted from the light emitting portion 30.

For this reason, it can be estimated that electrons and holes are dominantly recombined in the well layer 32 adjoining the p-type semiconductor layer 20.

This phenomenon was first found by the inventors through the results of the survey on the characteristics of the semiconductor light emitting devices 111 and 119.

The semiconductor light emitting device according to the embodiment is configured based on this newly-discovered phenomenon. The characteristics (for example, the peak wavelength) of the well layer 32 adjoining the p-type semiconductor layer 20 are adjusted to the characteristics (for example, the peak wavelength) required as a semiconductor light emitting device, and the configuration of the well layer 32 apart from the p-type semiconductor layer 20 is controlled so that light emitting efficiency would be improved and light absorption would be smaller. As a result, internal quantum efficiency and light extraction efficiency can be improved without adversely affecting the light emitting characteristics, such as the peak wavelength, of the semiconductor light emitting device.

In other words, in the semiconductor light emitting device 110 (the semiconductor light emitting device 111) according to the embodiment, the p-side end average In composition ratio Ap is set to be higher than the n-side end average In composition ratio An and is set to be not higher than 5 times the n-side end average In composition ratio An or smaller. Thereby, a proper distortion is caused in the p-side end well layer 32p1 and recombination of electrons and holes are promoted. In addition, the n-side end average In composition ratio An is set to be lower, so that the light absorption in the n-side end well layer 32n1 is suppressed. Also, injection efficiency of holes moving from the p-side end well layer 32p1 to the well layer 32p2, which is the second closest to the p-type semiconductor layer 20, is improved. As a result, the internal quantum efficiency and the light extraction efficiency can be improved.

For example, in the semiconductor light emitting device 119 according to the first comparative example, the $In_{0.15}Ga_{0.85}N$ layer used for the well layer 32 has an absorption coefficient of approximately $5 \times 10^4$ cm$^{-1}$ at the wavelength of 450 nm. Accordingly, approximately 1.2% of absorption is caused in each well layer 32, which means that the light absorption is large. In contrast, in the semiconductor light emitting device 111, the $In_{0.07}Ga_{0.93}N$ layer with a small In composition ratio is used as the well layer 32 on the side of the n-type semiconductor layer 10 (for example, the n-side end well layer 32n1 and the like) in order to shift an energy level in these well layers 32 toward a short wavelength (a high energy side). As a result, the absorption coefficient at the wavelength of 450 nm becomes approximately $5 \times 10^3$ cm$^{-1}$ and only approximately 0.12% of absorption is caused in each well layer 32. Thus, the light extraction efficiency is increased in the semiconductor light emitting device 111.

When the p-side end average In composition ratio Ap is equal to or smaller than the n-side end average In composition ratio An, a large distortion is added to the p-side end well layer 32p1 which is the closest to the p-type semiconductor layer 20. Thus, the low light emitting efficiency is obtained. Also, the light absorption becomes larger and the low light extraction efficiency is obtained. When the p-side end average In composition ratio Ap is higher than 5 times the n-side end average In composition ratio An, for example, the crystallinity is likely to be deteriorated and, thus, the low light emitting efficiency is obtained.

JP-A 2007-123878 (Kokai) proposes the configuration in which an energy band gap of a quantum well layer adjoining an n-type nitride semiconductor layer is set to be higher than that of a quantum well layer adjoining a p-type nitride semiconductor layer. However, JP-A 2007-123878 (Kokai) does not examine the relationship between the p-side end average In composition ratio Ap and the n-side end average In composition ratio An as described above. For this reason, it is thought that it is difficult by the technique disclosed in JP-A 2007-123878 (Kokai) to obtain high internal quantum efficiency and high light extraction efficiency that can be achieved in the semiconductor light emitting device according to the embodiment.

Figure 4:
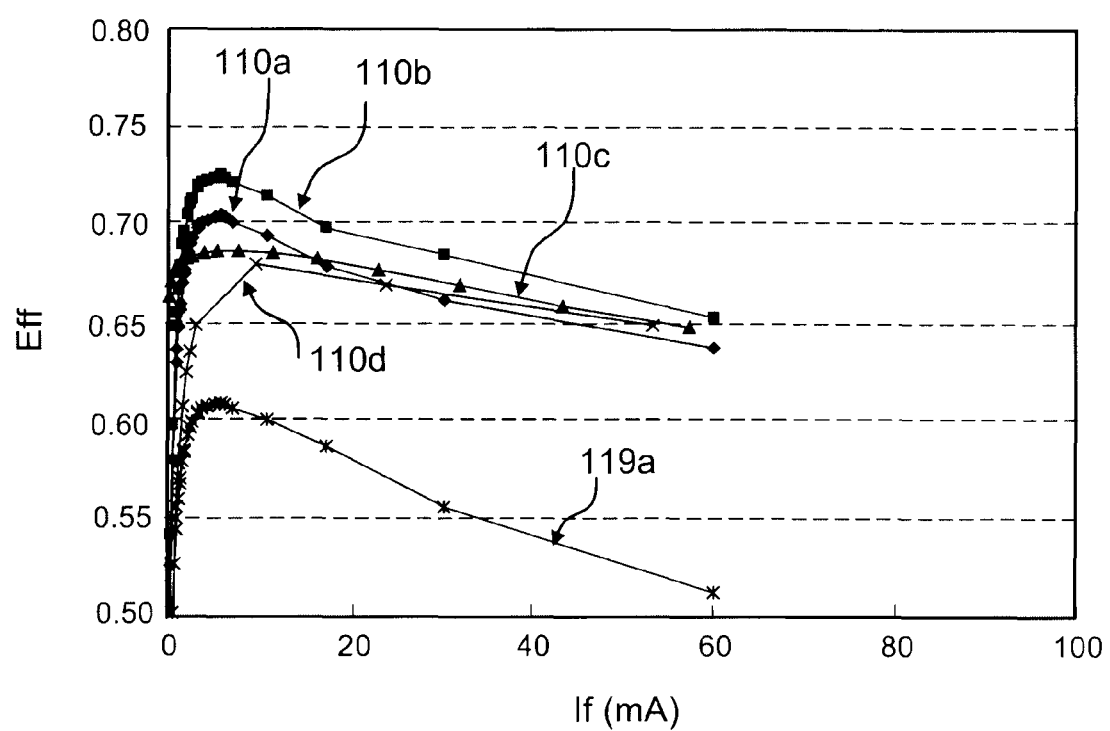
FIG. 4 is a graph showing characteristics of semiconductor light emitting devices of an embodiment and a comparative example.

FIG. 4 is a graph illustrating characteristics of semiconductor light emitting devices according to the embodiment and a comparative example.

More specifically, FIG. 4 shows simulation results of the characteristics of semiconductor light emitting devices 110a to 110d according to the embodiment and a semiconductor light emitting device 119a according to a second comparative example.

In the semiconductor light emitting device 110a, the In composition ratio wn of the n-side end well layer 32n1 is 0.07 and the n-side end well layer thickness $t_{wn}$ is 2.5 nm. The In composition ratio bn of the n-side end barrier layer 31n1 is 0.01 and the n-side end barrier layer thickness $t_{bn}$ is 5.0 nm. The In composition ratio wp of the p-side end well layer 32p1 is 0.15 and the p-side end well layer thickness $t_{wp}$ is 2.5 nm. The In composition ratio by of the p-side end barrier layer 31p1 is 0.01 and the p-side end barrier layer thickness $t_{bp}$ is 5.0 nm.

The total number of the well layers 32 (including the n-side end well layer 32n1 and the p-side end well layer 32p1) is 8. The total number of the barrier layers 31 (including the n-side end barrier layer 31n1, the p-side end barrier layer 31p1, and the p-side end opposite barrier layer 31p0) is 9. The configuration of another well layer 32 other than the n-side end well layer 32n1 and the p-side end well layer 32p1 is the same as that of the n-side end well layer 32n1. The configuration of the p-side end opposite barrier layer 31p0 is the same as that of the p-side end barrier layer 31p1. The configuration of the barrier layer 31 other than the n-side end barrier layer 31n1, the p-side end barrier layer 31p1, and the p-side end opposite barrier layer 31p0 is the same as that of the n-side end barrier layer 31n1.

As described above, in the semiconductor light emitting device 110a, the In composition ratio wp of the p-side end well layer 32p1 is higher than the In composition ratio wn of the n-side end well layer 32n1.

In the semiconductor light emitting device 110a, the n-side end average In composition ratio An is 0.030 and the p-side end average In composition ratio Ap is 0.057. Accordingly, the pn ratio Ap/An in the In average composition ratio becomes 1.9 in the semiconductor light emitting device 110a.

The semiconductor light emitting device 110b is formed in such a manner that the p-side end well layer 32p1 is replaced by $In_{0.13}Ga_{0.87}N$ with a thickness of 3.5 nm in the semiconductor light emitting device 110a.

In the semiconductor light emitting device 110b, the p-side end well layer thickness $t_{wp}$ is larger than the n-side end well thickness $t_{wn}$.

In the semiconductor light emitting device 110b, the n-side end average In composition ratio An is 0.030 and the p-side end average In composition ratio Ap is 0.059. Accordingly, the pn ratio Ap/An in the In average composition ratio becomes 2.0 in the semiconductor light emitting device 110b.

The semiconductor light emitting device 110c is formed in such a manner that the In composition ratio by of the p-side end barrier layer 31p1 is changed to 0.03 in the semiconductor light emitting device 110a.

As described above, in the semiconductor light emitting device 110c, the In composition ratio by of the p-side end barrier layer 31p1 is higher than the In composition ratio bn of the n-side end barrier layer 31n1.

In the semiconductor light emitting device 110c, the n-side end average In composition ratio An is 0.030 and the p-side end average In composition ratio Ap is 0.070. Accordingly, the pn ratio Ap/An in the In average composition ratio becomes 2.3 in the semiconductor light emitting device 110C.

The semiconductor light emitting device 110d is formed in such a manner that the thickness of the p-side end barrier layer 31p1 is changed to 4.0 nm in the semiconductor light emitting device 110a.

As described above, in the semiconductor light emitting device 110d, the p-side end barrier layer thickness $t_{bp}$ is smaller than the n-side end barrier layer thickness $t_{bn}$.

In the semiconductor light emitting device 110d, the n-side end average In composition ratio An is 0.030 and the p-side end average In composition ratio Ap is 0.064. Accordingly, the pn ratio Ap/An in the In average composition ratio becomes 2.1 in the semiconductor light emitting device 110d.

In contrast, in the light emitting portion 30 of the semiconductor light emitting device 119a according to the second comparative example, all the barrier layers 31 have the same configuration and all the well layers 32 have the same configuration. The In composition ratio of the well layer 32 is 0.15 and the thickness of the well layer is 2.5 nm. The In composition ratio of the barrier layer 31 is 0.01 and the thickness of the barrier layer 31 is 5.0 nm. Accordingly, the pn ratio Ap/An in the In average composition ratio is 1 in the semiconductor light emitting device 119a according to the second comparative example.

FIG. 4 illustrates the characteristics of these semiconductor light emitting devices 110a to 110d according to the embodiment and the semiconductor light emitting device 119a according to the second comparative example. In FIG. 4, the horizontal axis represents a current If flowing through each semiconductor light emitting device and the vertical axis represents light emitting efficiency Eff.

As shown in FIG. 4, all of the semiconductor light emitting devices 110a to 110d according to the embodiment have higher light emitting efficiency Eff as compared with that of the semiconductor light emitting device 119a according to the second comparative example.

In the semiconductor light emitting device 119a, it is thought that the low quantum efficiency is obtained because a large distortion is added to the p-side end well layer 32p1 which is the closest to the p-side semiconductor layer 20 most contributing to light emission.

In contrast, in the semiconductor light emitting device 110a in which the In composition ratio wp of the p-side end well layer 32p1 is higher than the In composition ratio wn of the n-side end well layer 32n1 and the semiconductor light emitting device 110b in which the p-side end well layer thickness $t_{wp}$ is larger than the n-side end well layer thickness $t_{wn}$, the distortion to be added to the p-side end well layer 32p1 which is the closest to the p-type semiconductor layer 20 is optimized. In addition, the light absorption in the well layer 32 on the side of the n-type semiconductor layer 10 (for example, including the n-side end well layer 32n1 and the like) is suppressed.

In addition, in the semiconductor light emitting device 110c in which the In composition ratio by of the p-side end barrier layer 31p1 is higher than the In composition ratio bn of the n-side end barrier layer 31n1 and the semiconductor light emitting device 110d in which the p-side end barrier layer thickness $t_{bp}$ is smaller than the n-side end barrier layer thickness $t_{bn}$, the distortion to be added to the p-side end well layer 32p1 which is the closest to the p-type semiconductor layer 20 is optimized. In addition, the injection efficiency of holes moving from the p-side end well layer 32n1 to the well layer 32p2 which is the second closest to the p-type semiconductor layer (the well layer 32 adjacent to the p-side end well layer 32p1 on the side of the n-type semiconductor layer 10) is improved.

When the In composition ratio wp of the p-side end well layer 32p1 is set to be higher than the In composition ratio wn of the n-side end well layer 32n1 and the p-side end well layer thickness $t_{wp}$ is set to be larger than the n-side end well layer thickness $t_{wn}$, the distortion to be added to the p-side end well layer 32p1 which is the closest to the p-type semiconductor layer 20 is optimized.

At this time, for example, it is preferable for a blue LED (light emitting peak wavelength is 445 nm to 455 nm, for example) that the In composition ratio wp of the p-side end well layer 32p1 is set to be not lower than 0.10 and not higher than 0.20 and the p-side end well layer thickness $t_{wp}$ is set to be not smaller than 1.0 nm and not larger than 5.0 nm. When the In composition ratio wp is relatively high, the p-side end well layer thickness $t_{wp}$ is set to be relatively small. For example, the In composition ratio wp of the p-side end well layer 32p1 is set to be approximately 0.15 and the p-side end well layer thickness $t_{wp}$ is set to be approximately 2.5 nm.

The In composition ratio wp may be substantially 0.15 (for example plus and minus 20 percents). The p-side end well layer thickness $t_{wp}$ may be substantially 2.5 nanometers (for example plus and minus 20 percents). The In composition ratio bn of the n-side end barrier layer 32p1 may be substantially twice (for example plus and minus 20 percents) the In composition ratio wn of the n-side end well layer 32n1. The n-side end barrier layer thickness $t_{bn}$ may be substantially twice (for example plus and minus 20 percents) the n-side end well layer thickness $t_{wn}$. The p-side end barrier layer thickness $t_{bp}$ may be substantially twice (for example plus and minus 20 percents) the p-side end well layer thickness $t_{wp}$.

In addition, when the In composition ratio wp of the p-side end well layer 32p1 is set to be higher than the In composition ratio wn of the n-side end well layer 32n1 and the In composition ratio by of the p-side end barrier layer 31p1 is set to be higher than the In composition ratio bn of the n-side end barrier layer 31n1, the distortion to be added to the p-side end well layer 32p1 which is the closest to the p-type semiconductor layer 20 is optimized. Moreover, the injection efficiency of holes moving from the p-side end well layer 32p1 to the well layer 32p2 which is the second closest to the p-type semiconductor layer 20 is improved. Furthermore, the light absorption in the well layer 32 on the side of the n-type semiconductor layer 10 can be suppressed.

When the In composition ratio wp of the p-side end well layer 32p1 is set to be higher than the In composition ratio wn of the n-side end well layer 32n1 and the p-side end barrier layer thickness $t_{bp}$ is set to be smaller than the n-side end barrier layer thickness $t_{bn}$, the distortion to be added to the p-side end well layer 32n1 which is the closest to the p-type semiconductor layer 20 is also optimized. In addition, the injection efficiency of holes moving from the p-side end well layer 32p1 to the well layer 32p2 which is the second closest to the p-type semiconductor layer 20 is improved. Furthermore, the light absorption in the well layer 32 on the side of the n-side semiconductor layer 10 can be suppressed.

It is assumed that the light emitting portion 30 has N(N is an integer of 2 or more) well layers 32 and N barrier layers 31 and the i-th (i is an integer of 2 to N) well layer 32 counted from the n-type semiconductor layer 10 is expressed as "the well layer $32_i$," and the i-th barrier layer 31 is expressed as "the barrier layer $31_i$". It is also assumed that the barrier layer $31_i$ is adjacent to the well layer $32_i$ on the side of the n-type semiconductor layer 10. The p-side end opposite barrier layer $31p0$ may be provided between the well layer $32_N$ which is the closest to the p-type semiconductor layer 20 (that is the p-side end well layer 32p1) and the p-type semiconductor layer 20, and the p-side end opposite barrier layer 31p0 corresponds to the barrier layer $31_{N+1}$.

With these expressions, the well layer $32_1$ contains $In_{wn}Ga_{1-wn}N$ and has the n-side end well layer thickness $t_{wn}$, the barrier layer $31_1$ contains $In_{bn}Ga_{1-bn}N$ and has the n-side end barrier layer thickness $t_{bn}$, and the well layer $32_N$ contains $In_{wp}Ga_{1-wp}N$ and has the p-side end well layer thickness $t_{wp}$, and the barrier layer $32_N$ contains $In_{bp}Ga_{1-bp}N$ and has the p-side end barrier layer thickness $t_{bp}$. Furthermore, as described above, these values are used to set Ap/An to be higher than 1 and not higher than 5.

In the embodiment, the configurations of the well layer 32 and the barrier layer 31 whose i is equal to or larger than 2 and equal to or smaller than (N−1) are arbitrarily. For example, it is assumed that the j-th (j is an integer of 2 to (N−1), both inclusive) well layer $32_j$ counted from the n-type semiconductor layer 10 contains $In_{wj}Ga_{1-wj}N$ and has a well layer thickness $t_{wj}$, and the j-th barrier layer $31_j$ contains $In_{bj}G_{1-bj}N$ and a barrier layer thickness $t_{bj}$. At this time, the average In composition ratio $A_j$ is arbitrarily when the average In composition ratio $A_j$ is defined as $(wj \times t_{wj} + bj \times t_{bj})/(t_{wj} + t_{bj})$. For example, it is preferable that the average In composition ratio $A_j$ is set to be a value not lower than the n-side end average In composition ratio An and not higher than the p-side end average In composition ratio Ap.

In particular, when j is equal to or smaller than (N−3), it is preferable that the average In composition ratio $A_j$ is set to be substantially equal to the n-side end average In composition ratio An (a low In composition ratio), so that the average In composition ratio on the side of the n-side semiconductor layer 10 is lowered and, thus, the light absorption can be suppressed.

In this description, "nitride semiconductors" are intended to include semiconductors with all the compositions which are obtained by changing each of composition ratios x, y, and z in the respective ranges in the chemical formula: $B_xIn_yAl_zGa_{1-x-y-z}N$ (0≤x≤1, 0≤y≤1, 0≤z≤1, x+y+z≤1). Furthermore, in the above chemical formula, the "nitride semiconductors" are intended to include: ones further containing the group V elements other than N (nitride); ones further containing various elements which are to be added to control various properties such as conductivity types; and ones further containing various elements which are unintentionally contained therein.

Hereinabove, exemplary embodiments of the invention are described with reference to specific examples. However, the invention is not limited to these specific examples. For example, various modifications made by one skilled in the art in regard to the configurations, sizes, material qualities, arrangements, etc., of components of semiconductor light emitting devices such as n-type semiconductor layers, p-type semiconductor layers, light emitting portions, well layers, barrier layers, electrodes, substrates, and buffer layers are included in the scope of the invention to the extent that the purport of the invention is included.

Further, any two or more components of the specific examples may be combined within the extent of technical feasibility; and are included in the scope of the invention to the extent that the purport of the invention is included.

Moreover, all semiconductor light emitting devices practicable by an appropriate design modification by one skilled in the art based on the semiconductor light emitting devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor light emitting device, comprising:
    an n-type semiconductor layer containing a nitride semiconductor;
    a p-type semiconductor layer containing a nitride semiconductor; and
    a light emitting portion provided between the n-type semiconductor layer and the p-type semiconductor layer, the light emitting portion including a plurality of barrier layers and a plurality of well layers, the plurality of barrier layers and the plurality of well layers being alternately stacked,
    the well layers including an n-side end well layer which is one of the well layers and is closest to the n-type semiconductor layer among the well layers, the n-side end well layer containing $In_{wn}Ga_{1-wn}N$, where In composition ratio wn is an atomic ratio of In among group III elements, the n-side end well layer having a layer thickness $t_{wn}$ (nanometer),
    the barrier layers including an n-side end barrier layer which is one of the barrier layers and is closest to the n-type semiconductor layer among the barrier layers, the n-side end barrier layer containing $In_{bn}Ga_{1-bn}N$, where In composition ratio bn is an atomic ratio of In among group III elements, the n-side end barrier layer having a layer thickness $t_{bn}$ (nanometer),
    the well layers including a p-side end well layer which is another of the well layers and is closest to the p-type semiconductor layer among the well layers, the p-side end well layer containing $In_{wp}Ga_{1-wp}N$, where In composition ratio wp is an atomic ratio of In among group III elements, the p-side end well layer having a layer thickness $t_{wp}$ (nanometer),
    the barrier layers including a p-side end barrier layer which is another of the barrier layers and is closest to the p-type semiconductor layer among the barrier layers in a region between the p-side end well layer and the n-type semiconductor layer, the p-side end barrier layer containing $In_{bp}Ga_{1-bp}N$, where In composition ratio by is an atomic ratio of In among group III elements, the p-side end barrier layer having a layer thickness $t_{bp}$ (nanometer),
    a first ratio being defined as $(wp \times t_{wp} + bp \times t_{bp})/(t_{wp} + t_{bp})$,
    a second ratio being defined as $(wn \times t_{wn} + bn \times t_{bn})/(t_{wn} + t_{bn})$,
    the first ratio being higher than 1.9 times the second ratio and being not higher than 2.3 times the second ratio,
    wherein the In composition ratio wp is higher than the In composition ratio wn and the thickness $t_{bp}$ is smaller than the thickness $t_{bn}$.

2. The device according to claim 1, wherein the layer thickness $t_{wp}$ is larger than the layer thickness $t_{wn}$.

3. The device according to claim 2, wherein the In composition ratio wp is not lower than 0.10 and not higher than 0.20.

4. The device according to claim 1, wherein the In composition ratio by is higher than the In composition ratio bn.

5. The device according to claim 1, wherein the In composition ratio wp is higher than the In composition ratio wn and the thickness $t_{wp}$ is larger than the thickness $t_{wn}$.

6. The device according to claim 1, wherein the In composition ratio wp is higher than the In composition ratio wn and the In composition ratio by is higher than the In composition ratio bn.

7. The device according to claim 1, wherein
    the light emitting portion has N (N is an integer of 2 or more) of the well layers,
    a j-th (j is an integer of 2 to (N−1)) well layer counted from the n-type semiconductor layer contains $In_{wj}Ga_{1-wj}N$, where In composition ratio wj is an atomic ratio of In among group III elements, and the j-th well layer has a well layer thickness $t_{wj}$,
    a j-th barrier layer counted from the n-type semiconductor layer contains $In_{bj}G_{1-bj}N$, where In composition ratio bj is an atomic ratio of In among group III elements, and the j-th barrier layer has a barrier layer thickness $t_{bj}$, and
    $(wj \times t_{wj} + bj \times t_{bj})/(t_{wj} + t_{bj})$ is not lower than the second ratio and is not higher than the first ratio.

8. The device according to claim 1, wherein
a light emitting peak wavelength emitted from the light emitting portion is not shorter than 445 nanometers and not longer than 455 nanometers,
the In composition ratio wp is not lower than 0.10 and not higher than 0.20, and
the thickness $t_{wp}$ is not smaller than 1.0 nanometer and not larger than 5.0 nanometers.

9. The device according to claim 1, wherein the In composition ratio wp is substantially 0.15 and the thickness $t_{wp}$ is substantially 2.5 nanometers.

10. The device according to claim 1, wherein
the p-side end well layer has a band gap energy corresponding to a light emitting peak wavelength of light emitted from the light emitting portion, and
the n-side end well layer has a band gap energy corresponding to a wavelength shorter than the light emitting peak wavelength.

11. The device according to claim 1, wherein the In composition ratio bn is substantially twice the In composition ratio wn.

12. The device according to claim 1, wherein the thickness $t_{bn}$ is substantially twice the thickness $t_{wn}$.

13. The device according to claim 1, wherein the n-type semiconductor layer includes an n-type GaN layer and an n-type layer, the n-type layer being provided between the n-type GaN layer and the light emitting portion and containing one of GaN containing Si and InGaN containing Si.

14. The device according to claim 1, wherein the p-type semiconductor layer includes a p-type GaN layer, a first p-type guide layer provided between the p-type GaN layer and the light emitting portion, a second p-type guide layer provided between the p-type GaN layer and the first p-type guide layer, and a third p-type guide layer provided between the first p-type guide layer and the second p-type guide layer.

15. The device according to claim 1, further comprising:
a substrate provided on a side of the n-type semiconductor layer opposite to the p-type semiconductor layer; and
a buffer layer provided between the substrate and the n-type semiconductor layer.

16. The device according to claim 1, wherein the plurality of barrier layers contain an n-type impurity.

17. The device according to claim 1, wherein a part of the n-type semiconductor layer, the light emitting portion, and the p-type semiconductor layer are partially removed on a first major surface on a side of the p-type semiconductor layer, and the n-type semiconductor layer is exposed on the first major surface.

18. The device according to claim 17, further comprising:
an n-side electrode in contact with the exposed n-type semiconductor layer; and
a p-side electrode in contact with the p-type semiconductor layer.

19. The device according to claim 1, wherein the first ratio is not higher than 2.1 times the second ratio.

20. The device according to claim 1, wherein the first ratio is not higher than 2.0 times the second ratio.

21. The device according to claim 1, wherein the In composition ratio wp is not lower than 0.10 and not higher than 0.20.

* * * * *